US010570522B2

(12) United States Patent
Yoshida et al.

(10) Patent No.: US 10,570,522 B2
(45) Date of Patent: Feb. 25, 2020

(54) ETCHING SOLUTION FOR COPPER OR COPPER ALLOY

(75) Inventors: Yutaka Yoshida, Kyoto (JP); Yukichi Koji, Tokyo (JP)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 13/816,862

(22) PCT Filed: Aug. 16, 2011

(86) PCT No.: PCT/US2011/047927
§ 371 (c)(1),
(2), (4) Date: Jun. 21, 2013

(87) PCT Pub. No.: WO2012/024300
PCT Pub. Date: Feb. 23, 2012

(65) Prior Publication Data
US 2013/0270217 A1    Oct. 17, 2013

(30) Foreign Application Priority Data

Aug. 16, 2010 (JP) ................ 2010-181485
Aug. 11, 2011 (JP) ................ 2011-175477

(51) Int. Cl.
*C23F 1/18* (2006.01)
*C23F 1/44* (2006.01)
*H01L 21/3213* (2006.01)
*H01L 21/768* (2006.01)
*H01L 23/00* (2006.01)

(52) U.S. Cl.
CPC .............. *C23F 1/18* (2013.01); *C23F 1/44* (2013.01); *H01L 21/32134* (2013.01); *H01L 21/76898* (2013.01); *H01L 24/03* (2013.01); H01L 21/76885 (2013.01); H01L 2224/0346 (2013.01); H01L 2224/03614 (2013.01); H01L 2224/0401 (2013.01); H01L 2224/05647 (2013.01); H01L 2224/11 (2013.01); H01L 2224/11912 (2013.01); H01L 2224/13083 (2013.01); H01L 2224/13111 (2013.01); H01L 2224/13139 (2013.01); H01L 2224/13144 (2013.01); H01L 2224/13147 (2013.01); H01L 2224/13155 (2013.01); H01L 2924/0103 (2013.01); H01L 2924/01004 (2013.01); H01L 2924/014 (2013.01); H01L 2924/0105 (2013.01); H01L 2924/01005 (2013.01); H01L 2924/01006 (2013.01); H01L 2924/01013 (2013.01); H01L 2924/01019 (2013.01); H01L 2924/01025 (2013.01); H01L 2924/01029 (2013.01); H01L 2924/01033 (2013.01); H01L 2924/01044 (2013.01); H01L 2924/01047 (2013.01); H01L 2924/01072 (2013.01); H01L 2924/01073 (2013.01); H01L 2924/01074 (2013.01); H01L 2924/01079 (2013.01); H01L 2924/01082 (2013.01); H01L 2924/14 (2013.01); H01L 2924/1461 (2013.01)

(58) Field of Classification Search
CPC ..... H01L 21/32134; H01L 2224/13147; H01L 2224/13155; C23F 1/18; C23F 1/26; C23F 1/44; C23F 1/02; C23F 1/14; C23F 1/34; C09K 3/1463; C09K 13/00; C09K 13/08; H05K 3/383; H05K 3/067
USPC .............................. 252/79.1–79.5
See application file for complete search history.

(56) References Cited

U.S. PATENT DOCUMENTS

| | | | |
|---|---|---|---|
| 4,375,384 A | 3/1983 | Molina | |
| 4,378,270 A * | 3/1983 | Brasch | C23F 1/18 205/585 |
| 4,401,509 A | 8/1983 | Schellinger | |
| 5,320,709 A | 6/1994 | Bowden et al. | |
| 5,705,089 A * | 1/1998 | Sugihara | C11D 3/361 252/79.1 |
| 5,993,685 A | 11/1999 | Currie et al. | |
| 6,086,779 A * | 7/2000 | Bishop et al. | 216/93 |
| 6,211,126 B1 | 4/2001 | Wojtczak et al. | |
| 6,244,785 B1 | 6/2001 | Richter et al. | |
| 6,280,651 B1 | 8/2001 | Wojtczak et al. | |
| 6,306,807 B1 | 10/2001 | Wojtczak et al. | |
| 6,322,600 B1 | 11/2001 | Brewer et al. | |
| 6,344,432 B1 | 2/2002 | Wojtczak et al. | |
| 6,346,741 B1 | 2/2002 | Van Buskirk et al. | |
| 6,395,194 B1 | 5/2002 | Russell et al. | |
| 6,426,020 B1 * | 7/2002 | Okada | C23F 1/14 252/79.1 |

(Continued)

FOREIGN PATENT DOCUMENTS

| | | |
|---|---|---|
| CN | 1370207 A | 9/2002 |
| CN | 101098989 A * | 1/2008 |

(Continued)

OTHER PUBLICATIONS

Machine Translation of CN 101098989 A produced by Google Patents translator.*

(Continued)

*Primary Examiner* — Nadine G Norton
*Assistant Examiner* — Christopher Remavege
(74) *Attorney, Agent, or Firm* — Entegris, Inc.

(57) ABSTRACT

A solution for selectively etching copper or a copper alloy from a microelectronic device, wherein the device simultaneously includes copper or a copper alloy and nickel-containing material, the solution being an etching solution for copper or a copper alloy comprising a chelating agent having an acid group in a molecule, hydrogen peroxide, and a surfactant having an oxyethylene chain in a molecule.

6 Claims, 2 Drawing Sheets

(56) References Cited

U.S. PATENT DOCUMENTS

| | | | |
|---|---|---|---|
| 6,566,315 B2 | 5/2003 | Wojtczak et al. | |
| 6,599,370 B2 | 7/2003 | Skee | |
| 6,602,440 B2 * | 8/2003 | Bishop et al. | 252/79.1 |
| 6,630,433 B2 * | 10/2003 | Zhang et al. | 510/175 |
| 6,686,322 B1 * | 2/2004 | Nohara | C03C 23/0075 134/2 |
| 6,692,546 B2 | 2/2004 | Ma et al. | |
| 6,755,989 B2 | 6/2004 | Wojtczak et al. | |
| 6,773,873 B2 | 8/2004 | Seijo et al. | |
| 6,800,218 B2 | 10/2004 | Ma et al. | |
| 6,802,983 B2 | 10/2004 | Mullee et al. | |
| 6,849,200 B2 | 2/2005 | Baum et al. | |
| 6,852,632 B2 | 2/2005 | Wang et al. | |
| 6,875,733 B1 | 4/2005 | Wojtczak et al. | |
| 6,896,826 B2 | 5/2005 | Wojtczak et al. | |
| 6,936,543 B2 * | 8/2005 | Schroeder et al. | 438/692 |
| 7,029,373 B2 | 4/2006 | Ma et al. | |
| 7,235,516 B2 * | 6/2007 | Morinaga et al. | 510/175 |
| 7,255,810 B2 * | 8/2007 | Moeggenborg | C09G 1/02 252/79.1 |
| 7,300,601 B2 | 11/2007 | Liu et al. | |
| 7,335,239 B2 | 2/2008 | Baum | |
| 7,465,408 B1 * | 12/2008 | Avanzino | C23C 22/52 216/100 |
| 7,534,752 B2 | 5/2009 | Wojtczak et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,960,328 B2 | 6/2011 | Visintin et al. | |
| 7,994,108 B2 | 8/2011 | Minsek et al. | |
| 8,026,200 B2 | 9/2011 | Cooper et al. | |
| 8,058,219 B2 | 11/2011 | Rath et al. | |
| 8,083,964 B2 * | 12/2011 | Yamada et al. | 216/88 |
| 8,236,485 B2 | 8/2012 | Minsek et al. | |
| 8,236,695 B2 | 8/2012 | Liu et al. | |
| 8,304,344 B2 | 11/2012 | Boggs et al. | |
| 8,338,087 B2 | 12/2012 | Rath et al. | |
| 2001/0054706 A1 | 12/2001 | Levert et al. | |
| 2002/0076930 A1 | 6/2002 | Jo et al. | |
| 2003/0228762 A1 * | 12/2003 | Moeggenborg et al. | 438/691 |
| 2004/0108302 A1 * | 6/2004 | Liu | C09G 1/02 216/83 |
| 2005/0233578 A1 * | 10/2005 | Jia | B23H 5/08 438/633 |
| 2006/0249482 A1 | 11/2006 | Wrschka et al. | |
| 2007/0251551 A1 | 11/2007 | Korzenski et al. | |
| 2008/0125342 A1 | 5/2008 | Visintin et al. | |
| 2008/0242090 A1 | 10/2008 | Yamada et al. | |
| 2008/0242574 A1 | 10/2008 | Rath et al. | |
| 2008/0286701 A1 * | 11/2008 | Rath | C23F 1/14 430/329 |
| 2009/0032766 A1 | 2/2009 | Rajaratnam et al. | |
| 2009/0068840 A1 * | 3/2009 | Minamihaba et al. | 438/693 |
| 2009/0212021 A1 | 8/2009 | Bernhard et al. | |
| 2009/0215269 A1 | 8/2009 | Boggs et al. | |
| 2009/0298289 A1 * | 12/2009 | Jeong | C09G 1/02 438/692 |
| 2010/0056410 A1 | 3/2010 | Visintin et al. | |
| 2010/0065530 A1 | 3/2010 | Walker et al. | |
| 2010/0087065 A1 | 4/2010 | Boggs et al. | |
| 2010/0112728 A1 * | 5/2010 | Korzenski | C09K 13/08 438/3 |
| 2010/0176082 A1 | 7/2010 | Cooper et al. | |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0049104 A1 * | 3/2011 | Kato et al. | 216/106 |
| 2011/0117751 A1 | 5/2011 | Sonthalia et al. | |
| 2012/0270396 A1 * | 10/2012 | Hosomi | 438/687 |

FOREIGN PATENT DOCUMENTS

| | | | |
|---|---|---|---|
| CN | 101454879 A | 6/2009 | |
| CN | 106435587 A | 2/2017 | |
| JP | 49-113799 A | 10/1974 | |
| JP | S5920471 A | 2/1984 | |
| JP | S5943879 A | 3/1984 | |
| JP | H09118996 A | 5/1997 | |
| JP | 10-158869 A | 6/1998 | |
| JP | H11006083 A | 1/1999 | |
| JP | 2000-286531 A | 10/2000 | |
| JP | 2002241968 A | 8/2002 | |
| JP | 2004-043895 A | 2/2004 | |
| JP | 2004-256901 A | 9/2004 | |
| JP | 2005105410 A | 4/2005 | |
| JP | 2008277723 A | 11/2008 | |
| JP | 2008285720 A | 11/2008 | |
| JP | 2009019270 A | 1/2009 | |
| JP | 2009120870 A | 6/2009 | |
| KR | 10-2002-0016907 A | 3/2002 | |
| KR | 10-2003-0061461 A | 7/2003 | |
| WO | WO 2009032460 A1 * | 3/2009 | C11D 7/265 |
| WO | 2010/017160 A2 | 2/2010 | |
| WO | 2012/009639 A2 | 1/2012 | |
| WO | 2012/051380 A2 | 4/2012 | |
| WO | 2012048079 A2 | 4/2012 | |
| WO | 2012/097143 A2 | 7/2012 | |

OTHER PUBLICATIONS

International Search Report, dated Mar. 19, 2012.
Chinese Office Action, dated Aug. 29, 2014.
Japanese Office Action, dated Aug. 31, 2016.
Chinese Office Action, dated Sep. 26, 2016.
Japanese Office Action, dated Mar. 3, 2016.

* cited by examiner

PRIOR ART

PRIOR ART

ETCHING SOLUTION FOR COPPER OR COPPER ALLOY

CROSS-REFERENCE TO RELATED APPLICATIONS

This application is filed under the provisions of 35 U.S.C. § 371 and claims the priority of International Patent Application No. PCT/US11/047927 filed on 16 Aug. 2011 and entitled "Etching Solution for Copper or Copper Alloy" which claims priority to Japanese Patent Application No. 2010-181485 filed on 16 Aug. 2010, and Japanese Patent Application No. 2011-175477 filed on 11 Aug. 2011, all of which are hereby incorporated herein by reference in their entireties.

FIELD

The present invention relates to a solution that etches copper or a copper alloy from a microelectronic substrate, and more particularly to a solution that selectively etches copper or a copper alloy from a microelectronic substrate having an electrode, e.g., a bump, made of copper or a copper alloy and nickel.

BACKGROUND

In microelectronic devices, miniaturization of elements and high integration has progressed in order to improve their performance with decreasing size. Disadvantageously in semiconductor devices, miniaturization techniques are approaching their limits. While devices having a three-dimensional structure such as wire bonding, flip chips, bumps or the like are being increasingly used, higher integration is still desired.

A technique for forming an electrode by forming a fine via that penetrates silicon, and filling the via with a conductive material such as copper (TSV technique) has been developed. Usually, in the case where copper is used as the electrode in the TSV technique, an opening is provided in a silicon substrate (1), and then a silicon oxide layer (2) (i.e., a low-k dielectric layer) and a barrier metal layer (3) of titanium, tantalum or the like are formed on an inner wall of the opening. Subsequently, a copper seed layer (4) is formed by a metal organic chemical vapor deposition method or a physical vapor deposition method (FIG. 1). Next, a protective film is formed with a resist resin (5) on the copper seed layer other than the portion on which the electrode is formed (FIG. 2). A metal such as copper (6) is embedded into the portion in which the protective film is not formed to form a bump. Disadvantageously, connection reliability is reduced by a surface oxidation phenomenon if the copper is not protected. Accordingly, usually, a nickel layer (7) and a solder layer of gold or an alloy of tin and silver (8) are each laminated (FIG. 3). Then, the bump (9) is formed by removing the resist resin (FIG. 4).

The copper seed layer and the barrier metal layer are formed not only within the opening of the silicon substrate but also on the surface of the silicon substrate, and remain even after the resist is removed. For this reason, the remaining copper seed layer and barrier metal layer must be removed by an etching solution (FIGS. 5 and 6). Among them, as a method for wet etching the copper seed layer, methods using an etching solution composed of an acid and an oxidizer, i.e., a mixed solution of sulfuric acid and hydrogen peroxide are widely used (Japanese Patent Application Laid-Open Nos. 2000-286531 and 2009-120870). Methods using an etching solution containing cupric chloride or ferric chloride are also widely known (Japanese Patent Application Laid-Open No. 2008-285720). Disadvantageously, these etching methods not only etch the copper seed layer formed in the electronic substrate, but also the bump is deformed because nickel used to form the bump is also etched.

Accordingly, the need remains in the art for a solution that can selectively etch copper or copper alloy relative to nickel-containing material from a microelectronic device simultaneously including copper or copper alloy and nickel-containing material.

SUMMARY

The present invention generally relates to a solution that can selectively etch copper or a copper alloy at a step of etching copper or a copper alloy from a microelectronic substrate including copper or a copper alloy and nickel-containing material.

In one aspect, a solution for selectively etching copper or a copper alloy from a microelectronic device simultaneously including copper or a copper alloy and nickel-containing material is described, the solution comprising a chelating agent (A) having an acid group in a molecule, hydrogen peroxide (B), and a surfactant (C) having an oxyethylene chain in a molecule. The solution can further comprise at least one component selected from the group consisting of at least one solvent (D), at least one anticorrosive component (E), at least one anti-oxidant (F), and at least one basic compound (G).

In another aspect, a method for producing a microelectronic device is described, the method comprising selectively etching copper or a copper alloy from the microelectronic device using a solution, wherein the device simultaneously includes copper or copper alloy and nickel-containing material, wherein the solution comprises a chelating agent (A) having an acid group in a molecule, hydrogen peroxide (B), and a surfactant (C) having an oxyethylene chain in a molecule. The solution can further comprise at least one component selected from the group consisting of at least one solvent (D), at least one anticorrosive component (E), at least one anti-oxidant (F), and at least one basic compound (G).

Other aspects, features and embodiments of the invention will be more fully apparent from the ensuing disclosure and appended claims.

DETAILED DESCRIPTION, AND PREFERRED EMBODIMENTS THEREOF

Figure 1:
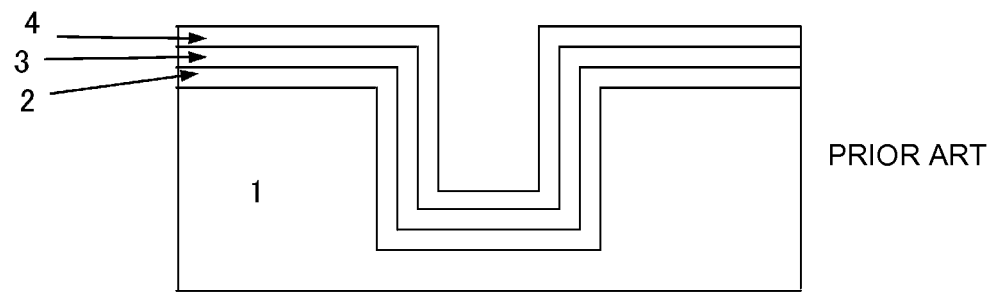
FIG. 1 is a sectional view of a silicon substrate (1) having an opening in which a silicon oxide layer (2), a barrier metal layer (3), and a copper seed layer (4) are laminated on an inner wall of the opening.
Figure 2:
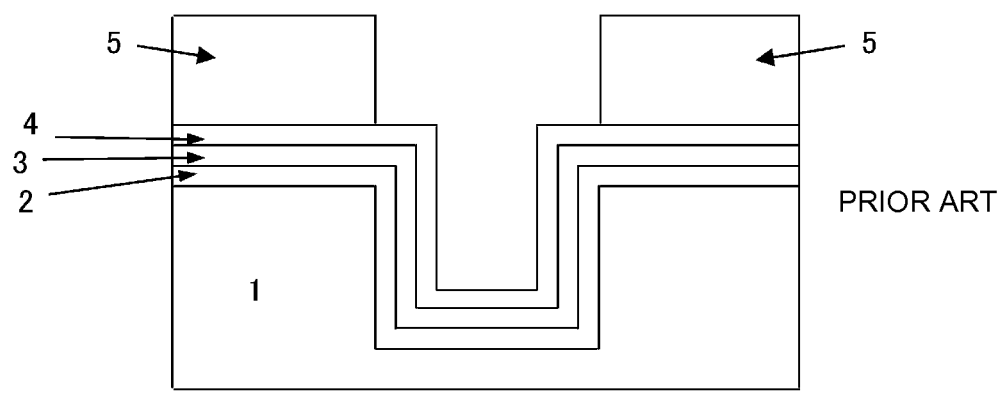
FIG. 2 is a sectional view of the silicon substrate after a resist resin (5) is applied and a protective film is formed on the silicon substrate of FIG. 1.
Figure 3:
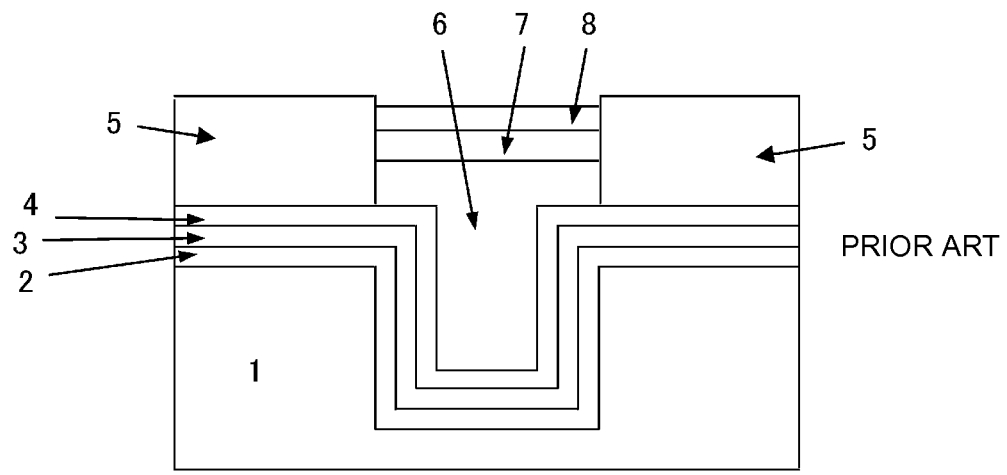
FIG. 3 is a sectional view of the silicon substrate after metals of copper (6), nickel (7) and gold (8) are further laminated on the silicon substrate of FIG. 2.

A solution for selectively etching copper or a copper alloy from a microelectronic device, wherein the copper or copper alloy is selectively removed relative to nickel-containing material is described herein. Further a method of using said solution to substantially remove copper or copper alloy from a microelectronic device, wherein the copper or copper alloy is selectively removed relative to simultaneously present nickel-containing material is described.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As defined herein, "copper or copper alloy" corresponds to copper (0) or mixtures (alloys) of copper and at least one additional component, e.g., zinc, tin, aluminum, silicon, nickel, phosphorus, iron, manganese, beryllium, cobalt, lead, and combinations thereof. It will be understood by the skilled artisan that copper or copper alloys that have undergone some surface reactions, e.g., oxidation, are still considered copper or copper alloys for the purposes of the present description. Examples of copper include those formed by a chemical vapor deposition method (CVD method), a physical vapor deposition method (PVD method), an atomic layer deposition method (ALD method), and plating.

As defined herein, the term "barrier metal layer" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, and other refractory metals and their nitrides and silicides thereof.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

"Substantially devoid" is defined herein as less than 2 wt. %, preferably less than 1 wt. %, more preferably less than 0.5 wt. %, and most preferably less than 0.1 wt. %.

As used herein, "about" is intended to correspond to ±5% of the stated value.

As used herein, "selectively etching copper or copper alloy relative to nickel-containing material" corresponds to a rate of removal of copper or copper alloy relative to nickel-containing material of at least 100:1, more preferably at least 1000:1, even more preferably at least 10000:1, and most preferably at least 100000:1.

As defined herein, "substantially devoid" corresponds to less than about 2 wt. %, more preferably less than 1 wt. %, even more preferably less than 0.1 wt. %, and most preferably 0 wt % of the composition, based on the total weight of said composition.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, a solution is described, said solution etching copper or copper alloy materials from a microelectronic device having same thereon, wherein said solution selectively etches copper or copper alloy relative to nickel-containing material. The solution can comprise, consist of, or consist essentially of at least one chelating agent (A) having an acid group in a molecule, hydrogen peroxide (B), and at least one surfactant (C) having an oxyethylene chain in a molecule. In another embodiment, the solution can comprise, consist of, or consist essentially of at least one chelating agent (A) having an acid group in a molecule, hydrogen peroxide (B), at least one surfactant (C) having an oxyethylene chain in a molecule, and at least one solvent (D). In another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), and at least one anticorrosive component (E). In another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), and at least one antioxidant (F). In still another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), at least one anticorrosive component (E), and at least one antioxidant (F). In yet another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), and at least one basic compound (G). In another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), at least one anticorrosive component (E), and at least one basic compound (G). In still another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), at least one antioxidant (F), and at least one basic compound (G). In yet another embodiment, the solution can comprise, consist of, or consist essentially of at least one chelating agent (A) having an acid group in a molecule, hydrogen peroxide (B), at least one surfactant (C) having an oxyethylene chain in a molecule, at least one solvent (D), at least one anticorrosive component (E), at least one anti-oxidant (F), and at least one basic or acidic compound (G).

As described herein, the chelating agent (A) having an acid group in a molecule, or a salt thereof, is added to increase the etching rate of copper or a copper alloy. Preferably, the chelating agent (A) having an acid group in a molecule has two or more functional groups, at least one of which is the acid group. Other functional groups contemplated include a neutral hydroxyl group or a phenolic hydroxyl group. Examples of the acid group in the chelating agent (A) include a carboxyl group, a phosphonic acid group, a sulfonic acid group, a phosphoric acid group, a sulfuric acid group, a nitric acid group, and a boric acid group. For example, the chelating agent (A) can include organic acids or salts thereof including two or more carboxyl groups as the acid group (A1), organic acids or salts thereof including two or more phosphonic acid groups as the acid group (A2), organic acids or salts thereof including two or more sulfonic acid group as the acid group (A3), and organic acids or salts thereof including one or more carboxyl group and one or more phosphonic acid group as the acid group (A4). The chelating agent (A) may be a chelating agent (A5) including only one carboxyl group, one phosphonic acid group, or one sulfonic acid group as the acid group as long as the chelating agent has a hydroxyl group that displays a chelate effect in the molecule. It should be appreciated that if more than one chelating agent is present, any combination of A1, A2, A3, A4 and A5 chelating agents is contemplated.

A1 chelating agents contemplated herein include, but are not limited to, ethylenediaminetetraacetic acid, diethylenetriaminepentaacetic acid, triethylenetetraminehexaacetic acid, hydroxyethylethylenediaminetriacetic acid, dihydroxyethylethylenediaminetetraacetic acid, nitrilotriacetic acid, hydroxyethyliminodiacetic acid, β-alaninediacetic acid, aspartate diacetic acid, methylglycinediacetic acid, iminodisuccinic acid, serinediacetic acid, hydroxyiminodisuccinic acid, tartaric acid, citric acid, pyromellitic acid, benzopolycarboxylic acid, cyclopentanetetracarboxylic acid, salts thereof and combinations thereof.

A2 chelating agents include, but are not limited to, methyldiphosphonic acid, aminotri(methylenephosphonic acid), 1-hydroxyethylidene-1,1-diphosphonic acid (HEDP), ethylenediaminetetra(methylenephosphonic acid), hexamethylenediaminetetra(methylenephosphonic acid), propylenediaminetetra(methylenephosphonic acid), diethylenetriaminepenta(methylenephosphonic acid), triethylenetetraminehexa(methylenephosphonic acid), triaminotriethylaminehexa(methylenephosphonic acid), trans-1,2-cyclohexanediaminetetra(methylenephosphonic acid), glycoletherdiaminetetra(methylenephosphonic acid), tetraethylenepentaminehepta(methylenephosphonic acid), salts thereof, and combinations thereof.

A3 chelating agents include, but are not limited to, methanedisulfonic acid, ethanedisulfonic acid, phenoldisulfonic acid, naphthalenedisulfonic acid, piperazine-1,4-bis(2-ethanesulfonic acid), salts thereof, and combinations thereof.

A4 chelating agents include, but are not limited to, phosphonoacetic acid, 2-hydroxy-2-phosphonoacetic acid, carboxyphosphonic acid, 3-phosphonopropionic acid, 4-(3-phosphonopropyl)-2-piperazinecarboxylic acid, salts thereof, and combinations thereof.

A5 chelating agents include, but are not limited to, lactic acid, salicylic acid, gallic acid, 2-hydroxyethylphosphonic acid, 2-hydroxyethanesulfonic acid, salts thereof, and combinations thereof.

The chelating agents most preferred are those from A1, A2, or A3, most preferably from A2. The content of the chelating agent (A) having an acid group in the molecule is preferably from about 0.1 to about 50% by weight, more preferably about 0.5 to about 30% by weight, and most preferably about 1 to about 20% by weight based on the total weight of the solution.

Hydrogen peroxide (B) is included to increase the etching rate of copper or copper alloy. An aqueous solution of hydrogen peroxide can be used as hydrogen peroxide (B). The content thereof in terms of purity is preferably from about 0.05 to about 20% by weight, more preferably about 0.1 to about 10% by weight, and most preferably about 0.2 to about 5% by weight based on the total weight of the solution.

The surfactant (C) having an oxyethylene chain in the molecule include nonionic surfactants such as ethylene oxide (EO) adducts of alkylamines (C1), EO adducts of monohydric alcohol (C2), EO adducts of polyhydric alcohol (C3), ethylene oxide propylene oxide copolymers (C4), EO adducts of alkylphenol (C5), and EO adducts of fatty acids (C6), anionic surfactants prepared by modifying a terminal of an EO adduct of alkyl alcohol (C7), anionic surfactants prepared by modifying a terminal of an EO adduct of alkylphenol (C8), and any combination thereof. Examples of the EO adducts of alkylamines (C1) include EO adducts of octylamines, and EO adducts of laurylamines. Examples of the EO adducts of monohydric alcohol (C2) include EO adducts of polyoxyethylene octyl ether, polyoxyethylene lauryl ether, and polyoxyethylene stearyl ether. Examples of the EO adducts of polyhydric alcohol (C3) include EO adducts of sucrose, EO adducts of sorbitol, EO adducts of pentaerythritol, and EO adducts of sorbitan monolaurate. Examples of the ethylene oxide-propylene oxide copolymers (C4) include ethylene oxide adducts of polyoxypropylene glycol and propylene oxide adducts of polyoxyethylene glycol. The number of mols of ethylene oxide to be added is 1 to 300, and the number of mols of propylene oxide to be added is 1 to 300. Use of an ethylene oxide-propylene oxide copolymer (C4) as the component (C) is particularly useful because it has an effect as an antifoaming agent. Examples of the EO adducts of alkylphenols (C5) include polyoxyethylene nonylphenyl ether, and polyoxyethylene octylphenyl ether. Examples of the EO adducts of fatty acids (C6) include polyethylene glycol monostearate, polyethylene glycol distearate, polyethylene glycol monooleate, and polyethyleneglycol dioleate. Examples of the anionic surfactants prepared by modifying a terminal of an EO adduct of alkyl alcohol (C7) include anionic surfactants prepared by modifying the EO adducts of monohydric alcohol (C2) with organic acids, such as polyoxyethylene octyl ether acetic acid (salt), polyoxyethylene lauryl ether acetic acid (salt), polyoxyethylene octyl ether sulfosuccinic acid (salt), polyoxyethylene lauryl ether sulfosuccinic acid (salt), polyoxyethylene octyl ether sulfunic acid ester (salt), and polyoxyethylene lauryl ether sulfuric acid ester (salt). Examples of the anionic surfactants prepared by modifying a terminal of an EO adduct of alkylphenol (C8) include anionic surfactants prepared by modifying the EO adducts of alkylphenol (C5) with organic acids, such as polyoxyethylene nonylphenyl ether sulfuric acid ester (salt), and polyoxyethylene octylphenyl ether sulfuric acid ester (salt). Preferably, the number of moles of EO present in the surfactant (C) having an oxyethylene chain in the molecule is 1 to 20, and preferably 2 to 15. Among the surfactants (C) having an oxyethylene chain in the molecule, preferred are the EO adducts of alkylamines (C1), the ethylene oxide propylene oxide copolymer (C4), and the anionic surfactants (C7) prepared by modifying a terminal of an EO adduct of alkyl alcohol from the viewpoints of the ratio of the etching rate of copper or a copper alloy relative to that of nickel-containing materials, and high wetability of a wafer. From the viewpoint of smaller metal impurities, more preferable are the EO adducts of alkylamines (C1). From the viewpoint of the antifoaming effect, more preferable are the ethylene oxide-propylene oxide copolymers (C4).

From the viewpoint of the etching rate of copper or a copper alloy, the ratio (A)/(B) of the weight of the chelating agent (A) having an acid group in the molecule to that of hydrogen peroxide (B) is preferably 1 to 30, more preferably 2 to 20, and particularly preferably 3 to 10. Moreover, the ratio (A)/(C) of the weight of the chelating agent (A) having an acid group in the molecule to that of the surfactant (C) is preferably 1 to 100, more preferably 2 to 50, and particularly preferably 5 to 30.

Solvents (D) include, but are not limited to, water, alcohols, glycol ethers, ethers, esters, ketones, carbonates, amides, and at combination thereof. Examples of the alcohols include methanol, ethanol, isopropanol, n-propanol, n-hexanol, n-octanol, 2-ethylhexanol, cyclohexanol, ethylene glycol, propylene glycol, 1,4-butanediol, 1,6-hexandiol, tetrahydrofurfuryl alcohol, and glycerol. Examples of the glycol ethers include propylene glycol monomethyl ether, propylene glycol monomethyl ether acetate, ethylene glycol monomethyl ether, ethylene glycol monomethyl ether acetate, ethylene glycol monomethyl ether propionate, ethylene glycol monobutyl ether, and ethylene glycol monobutyl ether acetate. Examples of the ethers include diethyl ether, diisopropyl ether, dibutyl ether, tetrahydrofuran, and 1,4-dioxane. Examples of the esters include ethyl lactate, methyl 3-methoxypropionate, methyl acetate, ethyl acetate, propyl acetate, and γ-butyrolactone. Examples of the ketones include acetone, methyl ethyl ketone, methyl isopropyl ketone, methyl isobutyl ketone, methyl amyl ketone, cyclopentanone, and cyclohexanone. Examples of the carbonates include dimethyl carbonate, diethyl carbonate, ethylene carbonate, and propylene carbonate. Examples of the amides include N,N-dimethylacetamide and N,N-dimethylformamide. Water is the preferred solvent.

In order to protect a wiring metal, at least one anticorrosive component (E) such as triazoles, imidazoles, thiol compounds, and sugar alcohols can be added to the solution when necessary. Examples of the triazoles include benzotriazole, o-tolyltriazole, m-tolyltriazole, p-tolyltriazole, carboxy benzotriazole, 1-hydroxybenzotriazole, nitrobenzotriazole, and dihydroxypropylbenzotriazole. Examples of the imidazoles include imidazole, benzimidazole, benzimidazole carboxylic acid, imidazole-2-carboxylic acid, imidazole-4-carboxylic acid, imidazole-2-carboxyaldehyde, imidazole-4-carboxyaldehyde, and 4-imidazoledithiocarboxylic acid. Examples of the thiol compounds include mercaptothiazole, mercaptoethanol, and thioglycerol. Examples of the sugar alcohols include erythritol, threitol, arabinitol, xylitol, ribitol, mannitol, sorbitol, maltitol, and inositol.

In order to protect a wiring metal, an antioxidant (F) can be added to the solution when necessary. Examples of the antioxidant include phenols such as catechin, tocopherol, catechol, methylcatechol, ethylcatechol, tert-butylcatechol, gallic acid, methyl gallate, and propyl gallate, 3-hydroxyflavone, and ascorbic acid.

A basic or acidic compound (G) can be added to the solution as a pH adjuster, as needed. The basic compound can be ammonia, amines, tetraalkylammonium hydroxides, and a nitrogen containing heterocyclic compound. Examples of the amines include fatty amines, alkanolamines, alkylene diamines, polyalkylene polyamines, aromatic amines, alicyclic amines, and guanidine. Examples of the fatty amines include methylamine, ethylamine, propylamine, isopropylamine, butylamine, hexylamine, dimethylamine, ethylmethylamine, propylmethylamine, butylmethylamine, diethylamine, propylethylamine, diisopropylamine, trimethylamine, ethyldimethyl amine, diethylmethylamine, triethylamine, tri-n-propylamine, and tri-n-butylamine. Examples of the alkanolamines include monoethanolamine, diethanolamine, triethanolamine, dimethylaminoethanol, diethylaminoethanol, 2-amino-2-methyl-1-propanol, N-(amino ethyl)ethanolamine, N,N-dimethyl-2-aminoethanol, and 2-(2-aminoethoxy)ethanol. Examples of the alkylene diamines include ethylenediamine, propylenediamine, trimethylenediamine, tetramethylenediamine, and hexamethylenediamine Examples of the polyalkylene polyamines include diethylenetriamine, triethylenetetramine, tetraethylenepentamine, hexamethyleneheptamine, iminobispropylamine, bis(hexamethylene)triamine, and pentaethylenehexamine. Examples of the aromatic amines include aniline, phenylenediamine, tolylenediamine, xylylenediamine, methylenedianiline, diphenyletherdiamine, naphthalenediamine, and anthracenediamine Examples of the alicyclic amines include isophoronediamine, cyclohexylenediamine, piperazine, N-aminoethylpiperazine, and 1,4-diaminoethylpiperazine. Examples of the tetraalkylammonium hydroxides include tetramethylammonium hydroxide, tetraethylammonium hydroxide, and choline. Examples of the nitrogen containing heterocyclic compounds include pyrrole, imidazole, pyrazole, oxazol, thiazole, pyridine, pyrimidine, pyridazine, pyrazine, bipyridine, and phenanthroline.

The acidic compound can be an inorganic acid such as sulfuric acid, hydrochloric acid, nitric acid, and hydrofluoric acid, and organic acids such as acetic acid. In order to stabilize the etching rate, the addition of inorganic acid or a salt thereof is also effective.

In a preferred embodiment, the pH is in a range from about 0 to about 5, more preferably about 1 to about 4, and most preferably about 2 to about 3.

An antifoaming agent can be added to the solution when necessary. Examples of antifoaming agents include silicone antifoaming agents, long-chain alcohol antifoaming agents, fatty acid ester antifoaming agents, and metal soap antifoaming agents. The ethylene oxide propylene oxide copolymers (C4) described above can be used as the antifoaming agent.

The solutions described herein may have utility in applications including, but not limited to, the removal of copper or copper alloy, preferably the selective removal of copper or copper alloy relative to nickel-containing materials. In addition, it is contemplated that the solutions described herein may be useful for the cleaning and protection of metal (e.g., copper-containing) products including, but not limited to, microelectronic devices, decorative metals, metal wire bonding, printed circuit boards and other electronic packaging using metal or metal alloys.

In a particularly preferred embodiment, the solution comprises, consists of, or consists essentially of HEDP, an EO adduct of lauryl amine, hydrogen peroxide and water.

In yet another preferred embodiment, the solutions described herein further include copper. The copper may be dissolved and/or suspended in the solutions.

The solutions of the invention are substantially devoid of abrasive material, fluoride sources, fluorinated carbon compounds, bioguanide compounds, serine, histidine and aspartic acid, and any combination thereof. Further, the solutions are not capable of forming resinous or polymer materials using the concentration of components described herein.

The solutions are easily formulated by simple addition of the respective ingredients and mixing to homogeneous condition. Furthermore, the solutions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the solution, i.e., more dilute or more concentrated, and it will be appreciated that the solutions described herein can variously and alternatively comprise, consist or consist essentially of any combination of ingredients consistent with the disclosure herein.

Accordingly, another aspect relates to a kit including, in one or more containers, one or more components adapted to form the solutions described herein. The kit may include, in one or more containers, at least one chelating agent (A) having an acid group in a molecule, hydrogen peroxide (B), at least one surfactant (C) having an oxyethylene chain in a molecule, optionally at least one solvent (D), optionally at least one anticorrosive component (E), optionally at least one anti-oxidant (F), and optionally at least one basic or acidic compound (G), for combining with solvent at the fab or the point of use. Alternatively, the kit may include, in a first container at least one chelating agent (A) having an acid group in a molecule, at least one surfactant (C) having an oxyethylene chain in a molecule, optionally at least one solvent (D), optionally at least one anticorrosive component (E), optionally at least one anti-oxidant (F), and optionally at least one basic or acidic compound (G), and in a second container hydrogen peroxide (B), for combining with each other and additional solvent at the fab or the point of use. The containers of the kit must be suitable for storing and shipping said solutions, for example, NOWPak® containers (Advanced Technology Materials, Inc., Danbury, Conn., USA).

In use of the solutions described herein for selectively removing copper and copper alloy from microelectronic devices having same thereon, the solution typically is contacted with the device for a preferred time of from about 30 sec to about 10 minutes at temperature in a range of from about 10° C. to about 100° C., preferably about 20° C. to about 80° C. Such contacting times and temperatures are illustrative, and any other suitable time and temperature conditions may be employed that are efficacious to selectively etch copper or copper alloy relative to nickel-containing materials, within the broad practice of the method.

In etching applications, the solution is applied in any suitable manner to the surface of the microelectronic device having the copper or copper alloy thereon, e.g., by spraying the solution on the surface of the device, by dipping or immersing (in a static or dynamic volume of the solution) of the device including the copper or copper alloy in the solution, by contacting the device with another material, e.g., a pad, or fibrous sorbent applicator element, that has the solution absorbed thereon, by contacting the device including the copper or copper alloy with a circulating solution, or by any other suitable means, manner or technique, by which the solution is brought into contact with the microelectronic device having the copper or copper alloy thereon. The application may be in a batch or single wafer apparatus, for dynamic or static cleaning. Advantageously, the solutions described herein, by virtue of their selectivity for copper or copper alloy material relative to other nickel-containing material that may be present on the microelectronic device structure and exposed to the solution, achieve removal of the copper or copper alloy in a highly efficient and highly selective manner.

Following the achievement of the desired etching action, the solution can be readily removed from the microelectronic device to which it has previously been applied, e.g., by rinse, wash, or other removal step(s), as may be desired and efficacious in a given end use application of the solutions of the present invention. For example, the device may be rinsed with a rinse solution including deionized water and/or dried (e.g., spin-dry, $N_2$, vapor-dry etc.).

Another aspect relates to an article of manufacture comprising a cleaning solution, a microelectronic device wafer, copper or copper alloy material, and nickel-containing material, wherein the solution comprises at least one chelating agent (A) having an acid group in a molecule, hydrogen peroxide (B), at least one surfactant (C) having an oxyethylene chain in a molecule, optionally at least one solvent (D), optionally at least one anticorrosive component (E), optionally at least one anti-oxidant (F), and optionally at least one basic or acidic compound (G).

The features and advantages are more fully shown by the illustrative examples discussed below.

EXAMPLE 1

The solutions described herein and the solutions for comparison were obtained by mixing the chelating agent (A), hydrogen peroxide (B), the surfactant (C), and water (D) shown in Table 1 in a container made of polypropylene.

TABLE 1

|  |  |  | Example | | | | | | Comparative Example | | | | |
|---|---|---|---|---|---|---|---|---|---|---|---|---|---|
|  |  |  | 1 | 2 | 3 | 4 | 5 | 6 | 1 | 2 | 3 | 4 | 5 |
| Number of parts blended (parts by weight) | Chelating agent (A) | citric acid | 10.0 |  |  |  |  |  | 10.0 | 10.0 |  |  | 10.0 |
|  |  | HEDP |  | 10.0 |  |  | 4.0 | 4.0 | 4.0 |  |  |  |  |
|  |  | EDA |  |  | 10.0 |  |  |  |  |  |  |  |  |
|  |  | NTMPA |  |  |  | 4.0 |  |  |  |  |  |  |  |
|  | Hydrogen peroxide (B) | $H_2O_2$ (35%) | 3.0 | 1.0 | 3.0 | 0.5 | 1.0 | 1.0 | 2.0 | 3.0 | 3.0 | 3.0 | 3.0 |
|  | Surfactant (C) | (C-1) | 1.0 |  | 0.5 | 0.2 |  | 0.5 | 0.5 |  | 1.0 | 1.0 | 1.0 |
|  |  | (C-2) |  | 1.0 |  |  | 0.5 |  |  |  |  |  |  |
|  |  | (C-3) |  |  |  |  |  | 0.5 |  |  |  |  |  |
|  |  | (C'-1) |  |  |  |  |  |  |  | 1.0 |  |  |  |
|  | Acid | Sulfuric acid |  |  |  | 0.1 |  |  |  |  | 10.0 |  |  |

TABLE 1-continued

|  |  | Example | | | | | | | Comparative Example | | | | |
| --- | --- | --- | --- | --- | --- | --- | --- | --- | --- | --- | --- | --- | --- |
|  |  | 1 | 2 | 3 | 4 | 5 | 6 | 7 | 1 | 2 | 3 | 4 | 5 |
|  | Solvent   Water | 86.0 | 88.0 | 86.5 | 95.3 | 94.5 | 94.5 | 94.5 | 87.0 | 86.0 | 86.0 | 96.0 | 89.0 |
|  | Weight ratio (A)/(B) | 9.5 | 17.1 | 9.5 | 22.9 | 6.9 | 6.9 | 3.4 | — | — | — | — | — |
|  | Weight ratio (A)/(C) | 10 | 6 | 20 | 20 | 4.8 | 4.8 | 2.4 | — | — | — | — | — |
| Evaluation of performance | Etching time of copper (minutes) | 1 | 3 | 1 | 10 | 5 | 5 | 3 | 1 | 1 | 1 | >60 | >60 |
|  | Amount of nickel etched | ○ | ○ | ○ | ○ | ○ | ○ | ○ | x | x | x | ○ | ○ |

Symbols in Table 1 correspond to the following compounds:
HEDP: 60% 1-Hydroxyethylidene-1,1-diphosphonic acid aqueous solution
EDA: 1,2-Ethanedisulfonic acid dihydrate
NTMPA: Nitrilotrismethylenephosphonic acid
(C-1): 8 Mol EO adduct of lauryl amine
(C-2): Sulfuric acid ester sodium salt of 2.5 Mol EO adduct of lauryl alcohol
(C-3): EO adduct of polyoxypropylene glycol (about 10 to about 50 mols of propylene oxide, preferably about 31 mols of propylene oxide; about 30 to about 60 mols of propylene oxide, preferably about 45 mols of propylene oxide)
(C'-1): Stearyltrimethylammonium chloride As evaluation of performance, etching time of copper and etching performance (etching amount) of nickel were evaluated by the following methods.

Figure 4:
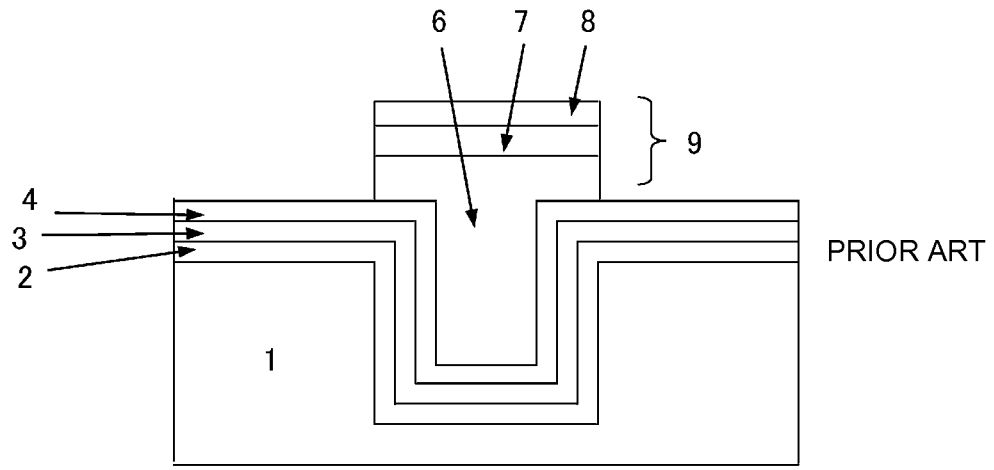
FIG. 4 is a sectional view of the silicon substrate after the resist resin is removed from the silicon substrate of FIG. 3.

The etching time of copper was evaluated by the following method:

(1) A wafer produced by processing a silicon substrate into that illustrated in FIG. 4 (the thickness of the copper seed layer was 1 μm) was cut into 15-mm squares to prepare test pieces. Using a scanning electron microscope (SEM; Hitachi High-Technologies Corporation, S-4800), a cross section of a test piece prepared by cutting a wafer into a 1 cm square was observed. The width of the bump was approximately 30 μm, and the height of the bump was approximately 8 μm. The thickness of the copper seed layer was 1 μm.

(2) Each of the etching solutions prepared in Examples 1 to 7 and Comparative Examples 1 to 5 was placed into a container made of polypropylene, and were stirred. The test pieces were immersed in the etching solutions, respectively.

Figure 5:
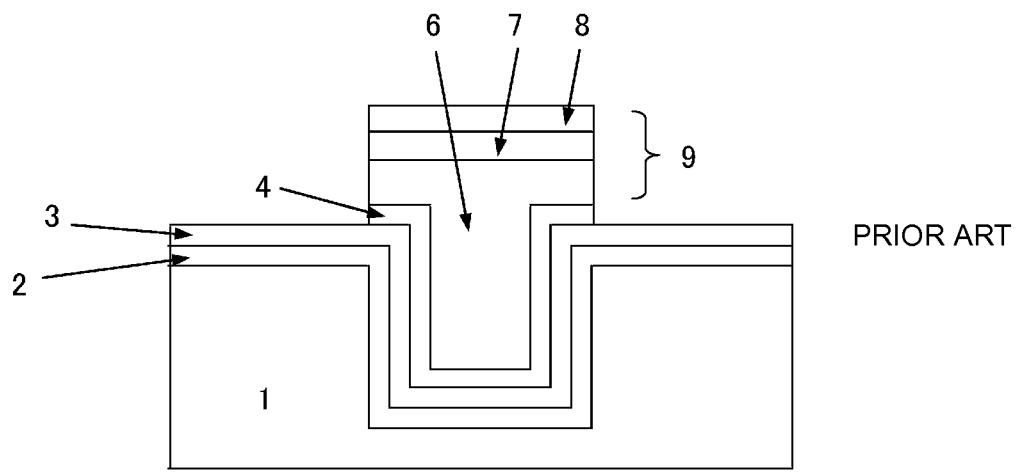
FIG. 5 is a sectional view of the substrate after the copper seed layer is removed from the silicon substrate of FIG. 4.
Figure 6:
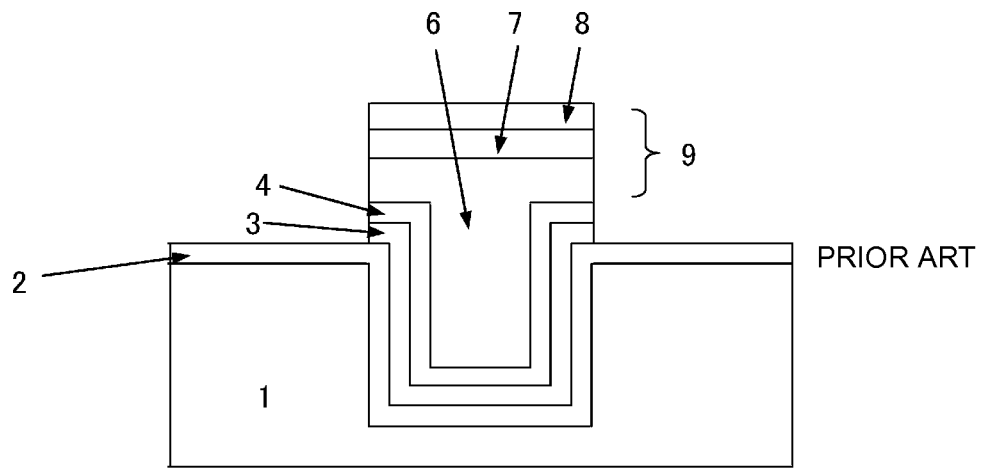
FIG. 6 is a sectional view of the silicon substrate after the barrier metal layer is removed from the silicon substrate of FIG. 5.

(3) The surface of the test pieces immersed in the etching solution was visually observed, and the time until gloss of copper on the whole surface of the copper seed layer disappeared (for example, (3) in FIG. 5: until the whole surface of the titanium layer can be seen) was measured.

Preferably, the time until the gloss of copper disappears is preferably not more than 10 minutes. With respect to the test pieces in which gloss did not disappear after 60 minutes, immersion was stopped after 60 minutes, and the evaluation is shown as ">60" in Table 1.

The amount of nickel to be etched was determined according to the following method. Using SEM, photographs of the side surface of the test piece were taken before the copper seed layer was etched and after the copper seed layer was etched such that the degree of the nickel layer to be corroded and the width thereof to be corroded can be determined From the photographic images, the width $A_1$ (μm) of the nickel layer of the test piece before etching the copper seed layer (7 in FIG. 4) and the width $A_2$ (μm) of the nickel layer of the test piece after etching (7 in FIG. 7) were measured. If the difference $A_1-A_2$ between the widths of the nickel layer before and after etching was less than 1.0 μm, it was characterized as ○; if the difference was not less than 1.0 μm, it was characterized as x.

As can be seen in Table 1, in Examples 1 to 5, the copper seed layer was rapidly etched while etching of the nickel portion was not observed. Namely, a desired bump could be formed and not be degraded during the removal of the copper seed layer.

On the other hand, in Comparative Example 1 and Comparative Example 2 not including the surfactant (C) having an oxyethylene chain in the molecule as described herein, the copper seed layer is rapidly etched but nickel is etched as well, resulting in a deformed bump. As a result, the wafer cannot be used. Also, in Comparative Example 3 using sulfuric acid instead of the chelating agent (A), the copper seed layer is rapidly etched but nickel is etched as well, resulting in a deformed bump. As a result, the wafer cannot be used. In Comparative Example 4 not including the chelating agent (A), neither the copper seed layer nor nickel were etched. In Comparative Example 5 not including hydrogen peroxide (B), neither the copper seed layer nor nickel were etched.

\* \* \*

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

The invention claimed is:

1. A method for producing a microelectronic device, the method comprising contacting a microelectronic device simultaneously including copper or a copper alloy and nickel-containing material with a solution consisting of at least one chelating agent (A) having an acid group in a molecule, hydrogen peroxide (B), at least one surfactant (C) having an oxyethylene chain in a molecule, and at least one solvent (D), wherein the pH of the solution is in a range from about 0 to less than about 5;

wherein the at least one chelating agent (A) comprises a species selected from the group consisting of methyldiphosphonic acid, aminotri(methylenephosphonic acid), 1-hydroxyethylidene-1, 1-diphosphonic acid (HEDP), ethylenediaminetetra(methylenephosphonic acid), hexamethylenediaminetetra(methylenephosphonic acid), propylenediaminetetra(methylenephosphonic acid), triethylenetetraminehexa(methylenephosphonic acid), diethylenetriaminepenta(methylenephosphonic acid), triaminotriethylaminehexa(methylenephosphonic acid), trans-1,2-cyclohexanediaminetetra(methylenephosphonic acid), glycoletherdiaminetetra(methylenephosphonic acid), tetraethylenepentaminehepta(methylenephosphonic acid), phosphonoacetic acid, 2-hydroxy-2-phosphonoacetic acid, 3-phosphonopropionic acid, 4-(3-phosphonopropyl)-2-piperazinecarboxylic acid, salts thereof, and combinations thereof;

wherein the at least one surfactant (C) having an oxyethylene chain in the molecule is selected from the group consisting of ethylene oxide (EO) adducts of alkylamines, EO adducts of monohydric alcohols, EO adducts of sucrose, EO adducts of sorbitol, EO adducts of sorbitan monolaurate, EO adducts of polyoxypropylene glycol, propylene oxide adducts of polyoxyethylene glycol, EO adducts of alkyl phenols, EO adducts of fatty acids, anionic surfactants prepared by modifying a terminal of an EO adduct of alkyl alcohols, anionic surfactants prepared by modifying a terminal of an EO adduct of alkyl phenols, and any combination thereof; and selectively removing the copper or the copper alloy relative to the nickel-containing material.

2. The method according to claim 1, wherein the at least one surfactant (C) having an oxyethylene chain in the molecule is selected from the group consisting of ethylene oxide (EO) adducts of alkylamines, EO adducts of monohydric alcohols, EO adducts of alkyl phenols, EO adducts of fatty acids, and any combination thereof.

3. The method according to claim 1, wherein the at least one surfactant (C) comprises an ethylene oxide adduct of an alkylamine.

4. The method according to claim 1, wherein the at least one surfactant (C) comprises EO adducts of octylamines, EO adducts of laurylamines, or a combination thereof.

5. The method according to claim 1, wherein the at least one solvent comprises a species selected from the group consisting of water, methanol, ethanol, isopropanol, n-propanol, n-hexanol, n-octanol, 2-ethylhexanol, cyclohexanol, ethylene glycol, propylene glycol, 1,4- butanediol, 1,6-hexendiol, tetrahydrofurfuryl alcohol, glycerol, propylene glycol monomethyl ether, propylene glycol monomethyl ether acetate, ethylene glycol monomethyl ether, ethylene glycol monomethyl ether acetate, ethylene glycol monomethyl ether propionate, ethylene glycol monobutyl ether, ethylene glycol monobutyl ether acetate, diethyl ether, diisopropyl ether, dibutyl ether, tetrahydrofuran, 1,4-dioxane, ethyl lactate methyl 3-methoxypropionate, methyl acetate, ethyl acetate, propyl acetate, γ-butyrolactone, acetone, methyl ethyl ketone, methyl isopropyl ketone, methyl isobutyl ketone, methyl amyl ketone, cyclopentanone, cyclohexanone, dimethyl carbonate, diethyl carbonate, ethylene carbonate, propylene carbonate, N,N-dimethylacetamide, N,N-dimethylformamide, and combinations thereof.

6. The method according to claim 1, wherein the at least one solvent comprises water.

* * * * *